US 6,548,861 B2

(12) United States Patent
Palm et al.

(10) Patent No.: US 6,548,861 B2
(45) Date of Patent: Apr. 15, 2003

(54) MEMORY CELL, MEMORY CELL ARRANGEMENT AND FABRICATION METHOD

(75) Inventors: Herbert Palm, Höhenkirchen (DE); Josef Willer, Riemerling (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/900,649

(22) Filed: Jul. 6, 2001

(65) Prior Publication Data

US 2003/0006428 A1 Jan. 9, 2003

(30) Foreign Application Priority Data

Jun. 21, 2001 (DE) ......................... 101 29 958

(51) Int. Cl.$^7$ .................. H09L 29/96; H09L 29/94; H09L 31/062; H09L 31/112; H09L 31/119
(52) U.S. Cl. ...................... 257/330; 257/331
(58) Field of Search ................. 257/330, 331, 257/332, 333, 334; 438/259, 270, 291, 589

(56) References Cited

U.S. PATENT DOCUMENTS

| | | | |
|---|---|---|---|
| 5,321,289 A | 6/1994 | Baba et al. .............. 257/331 |
| 5,768,192 A | 6/1998 | Eitan ..................... 365/185.24 |
| 5,894,149 A * | 4/1999 | Uenishi et al. ........... 257/331 |
| 6,011,725 A | 1/2000 | Eitan ..................... 365/185.33 |
| 6,080,624 A | 6/2000 | Kamiya et al. ........... 438/257 |
| 6,172,395 B1 | 1/2001 | Chen et al. .............. 257/315 |
| 6,191,459 B1 | 2/2001 | Hofmann et al. ......... 257/390 |
| 6,194,741 B1 * | 2/2001 | Kinzer et al. ............ 257/77 |
| 6,204,529 B1 | 3/2001 | Lung et al. ............. 257/314 |
| 6,373,097 B1 * | 4/2002 | Werner .................. 257/329 |
| 6,376,315 B1 * | 4/2002 | Hshieh et al. ........... 438/270 |
| 6,445,037 B1 * | 9/2002 | Hshieh et al. ........... 257/330 |

FOREIGN PATENT DOCUMENTS

| | | |
|---|---|---|
| DE | 195 45 903 A1 | 6/1997 |
| DE | 100 39 441 A1 | 2/2002 |
| JP | 2000 058 684 A | 2/2000 |
| WO | WO 99/60631 | 11/1999 |

OTHER PUBLICATIONS

Junko Tanaka et al.: "A Sub–0.1–$\mu$m Grooved Gate MOSFET with High Immunity to Short–Channel Effects", IEDM 93, pp. 537–540.

Ken–ichiro Nakagawa et al.: "A Flash EEPROM Cell with Self–Aligned Trench Transistor & Isolation Structure", 2000 Symposium on VLSI Technology Digest of Technical Papers.

Boaz Eitan et al.: "NROM: A Novel Localized Trapping, 2–Bit Nonvolatile Memory Cell", IEEE Electron Device Letters, vol. 21, No. 11, Nov. 2000, pp. 543–545.

* cited by examiner

Primary Examiner—Long Pham
Assistant Examiner—Hoai Pham
(74) Attorney, Agent, or Firm—Laurence A. Greenberg; Werner H. Stemer; Gregory L. Mayback

(57) ABSTRACT

An electrically conductive layer or layer sequence preferably includes a metal-containing layer applied to a metal silicide or a polysilicon layer to reduce the resistance of buried bit lines. The layer or layer sequence has been patterned in strip form so as to correspond to the bit lines and is arranged on the source/drain regions of memory transistors having an ONO memory layer sequence and gate electrodes that are arranged in trenches. The metal silicide is preferably cobalt silicide, and the metal-containing layer is preferably tungsten silicide or WN/W.

10 Claims, 13 Drawing Sheets

FIG 3
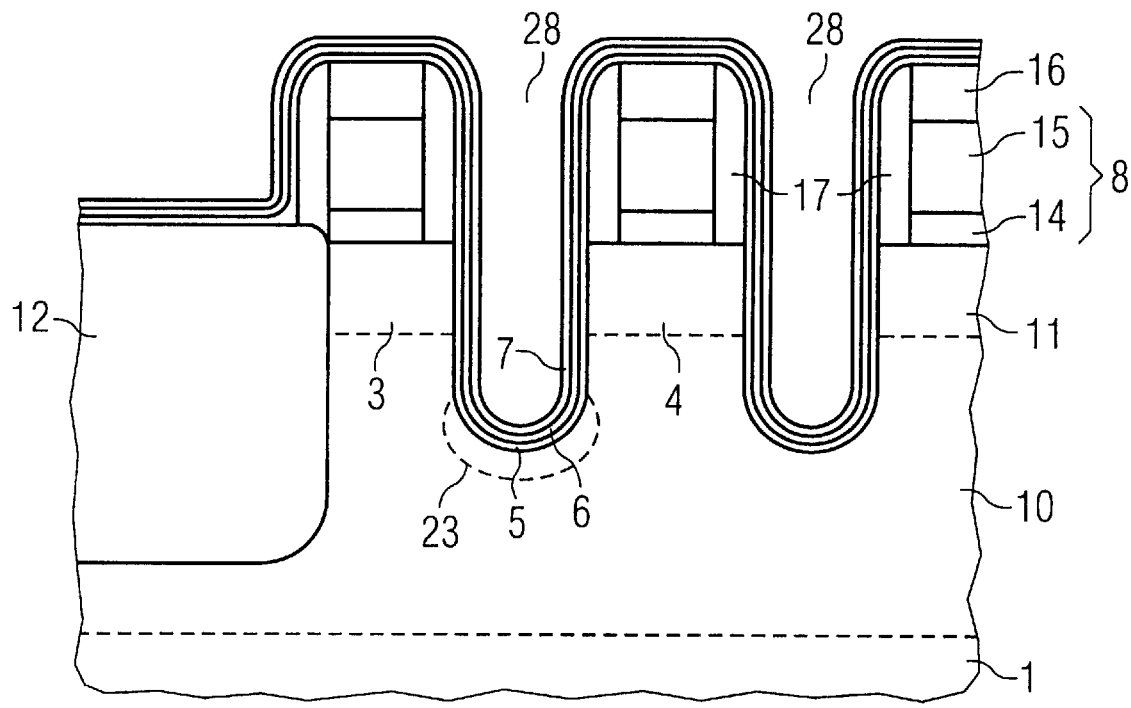
FIG 3.3a
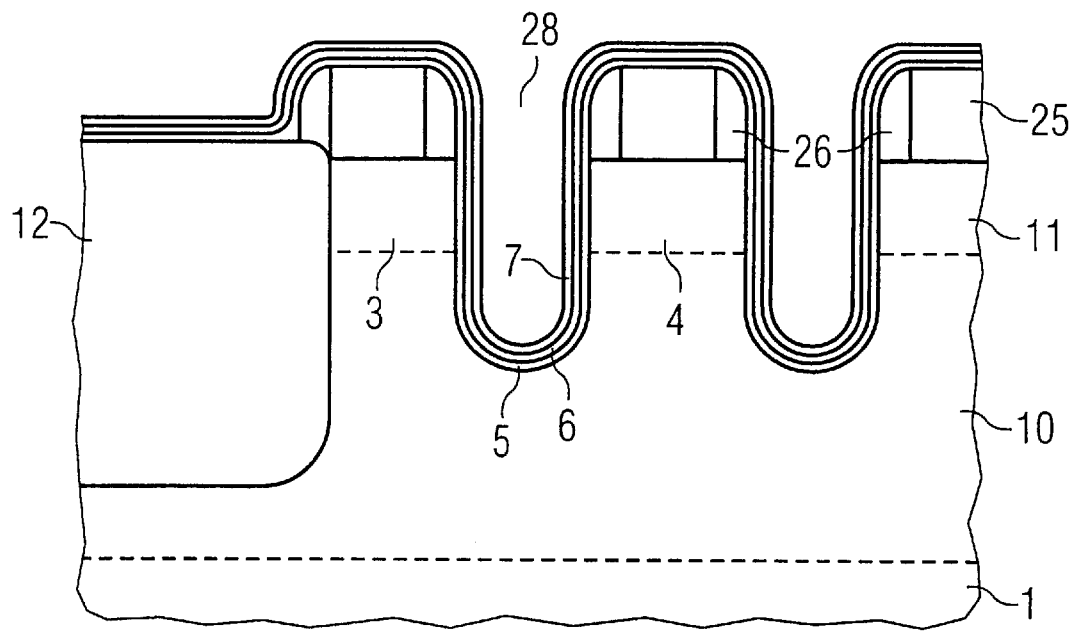

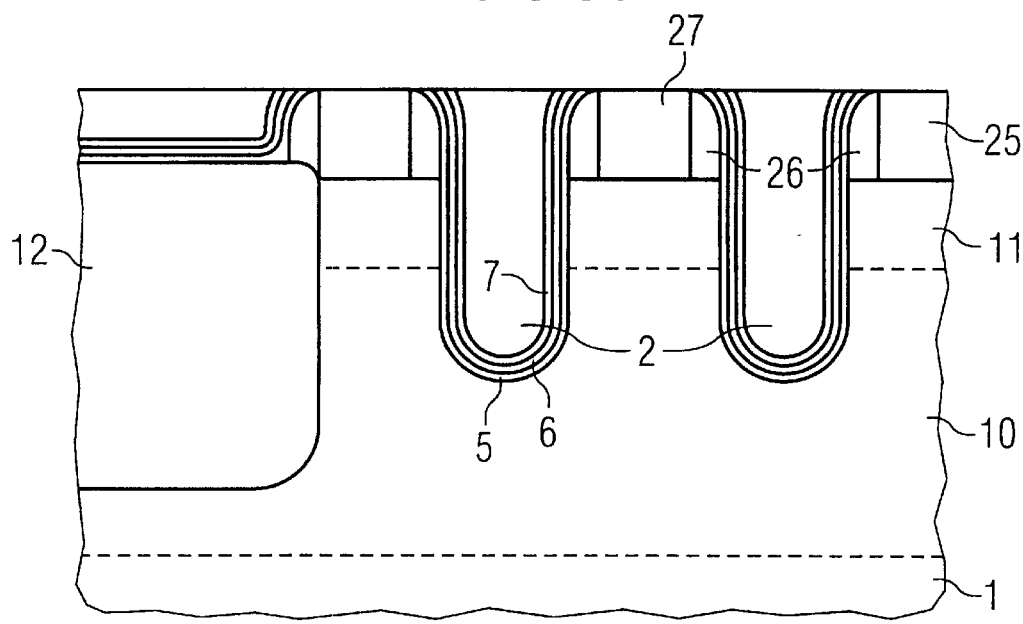
FIG 3.3b
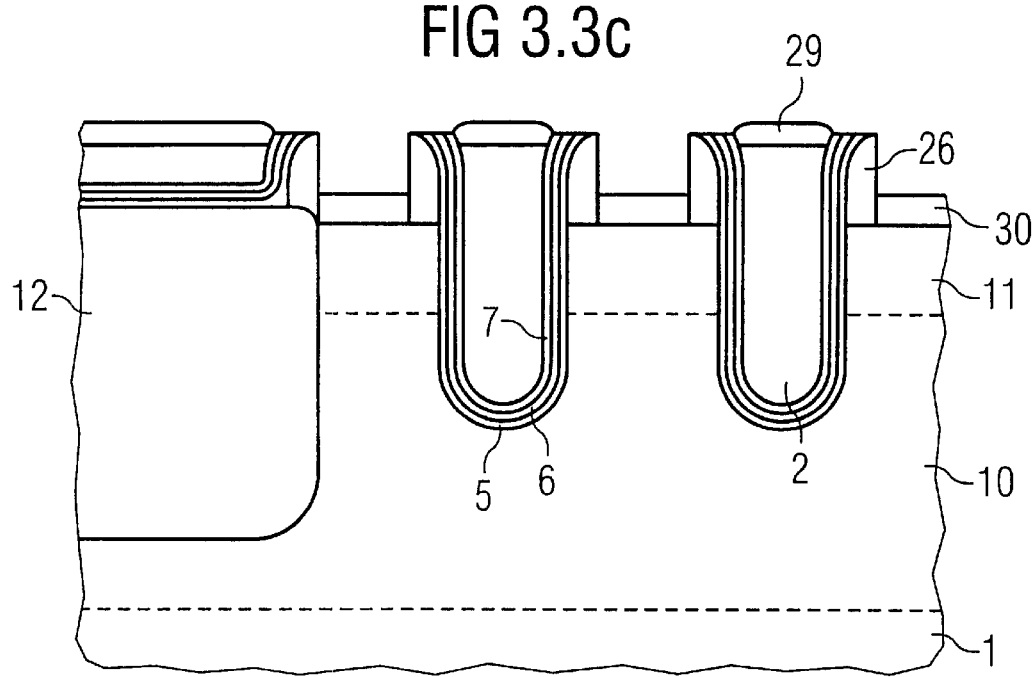
FIG 3.3c

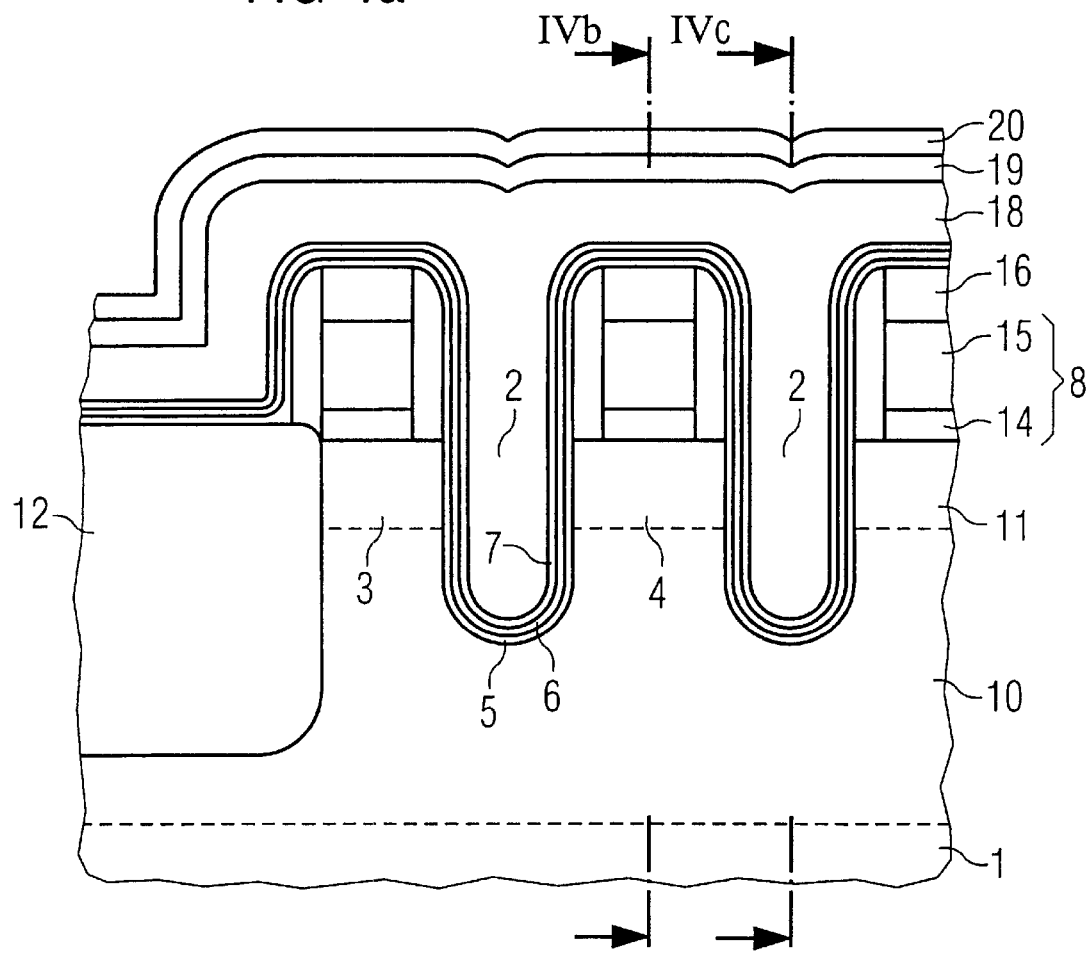

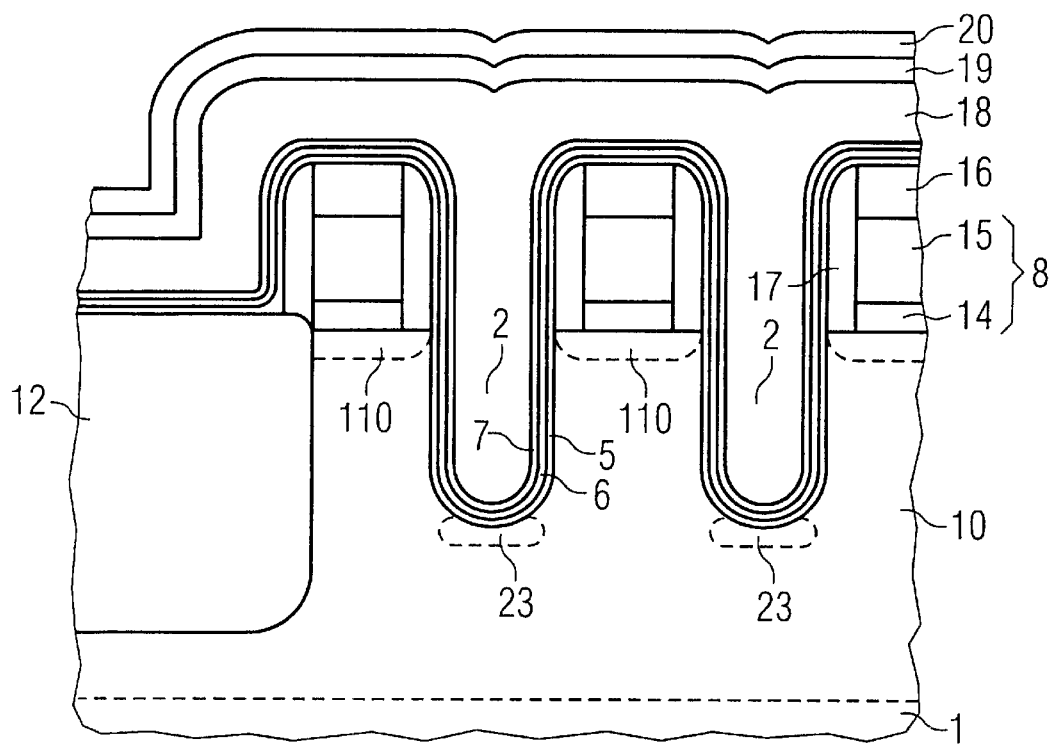
FIG 4.1
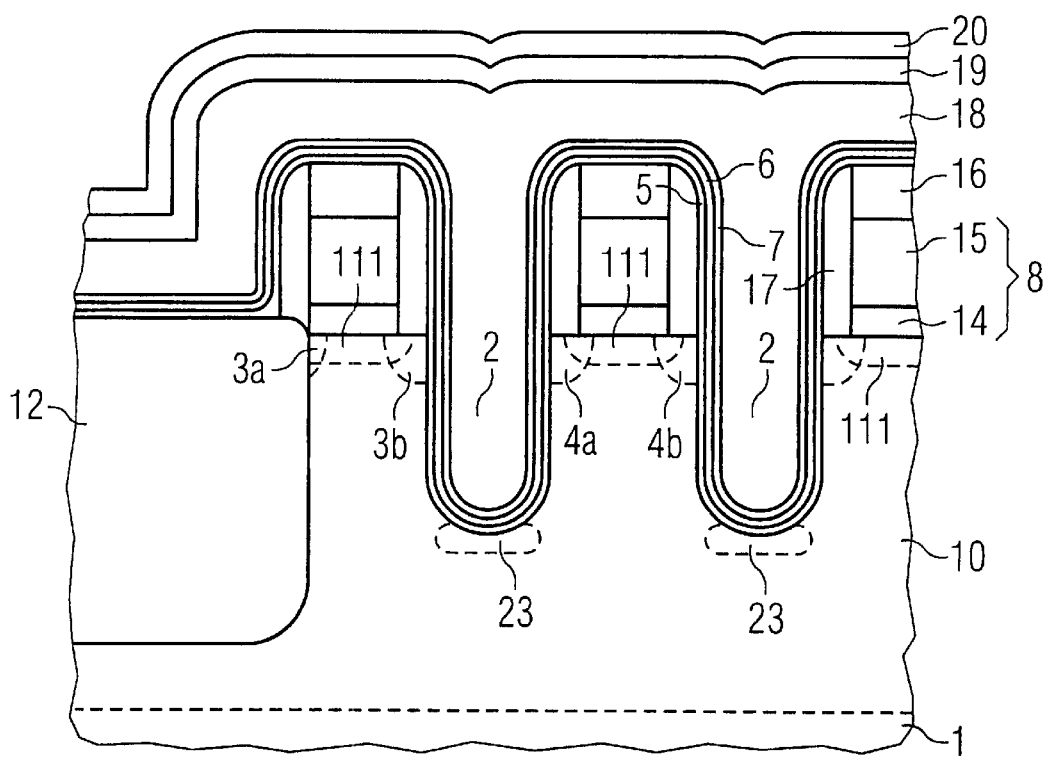
FIG 4.11

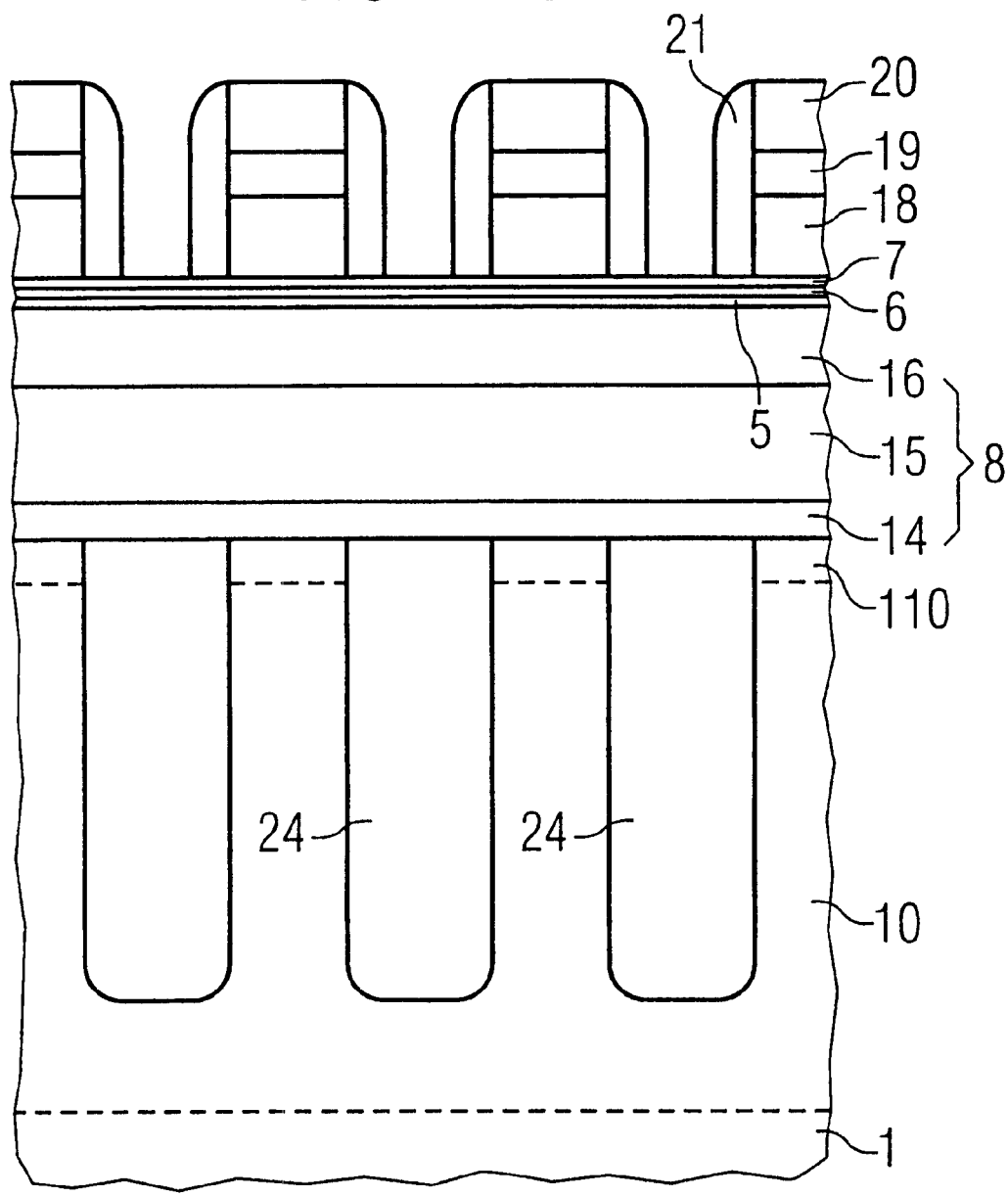
FIG 4.2b

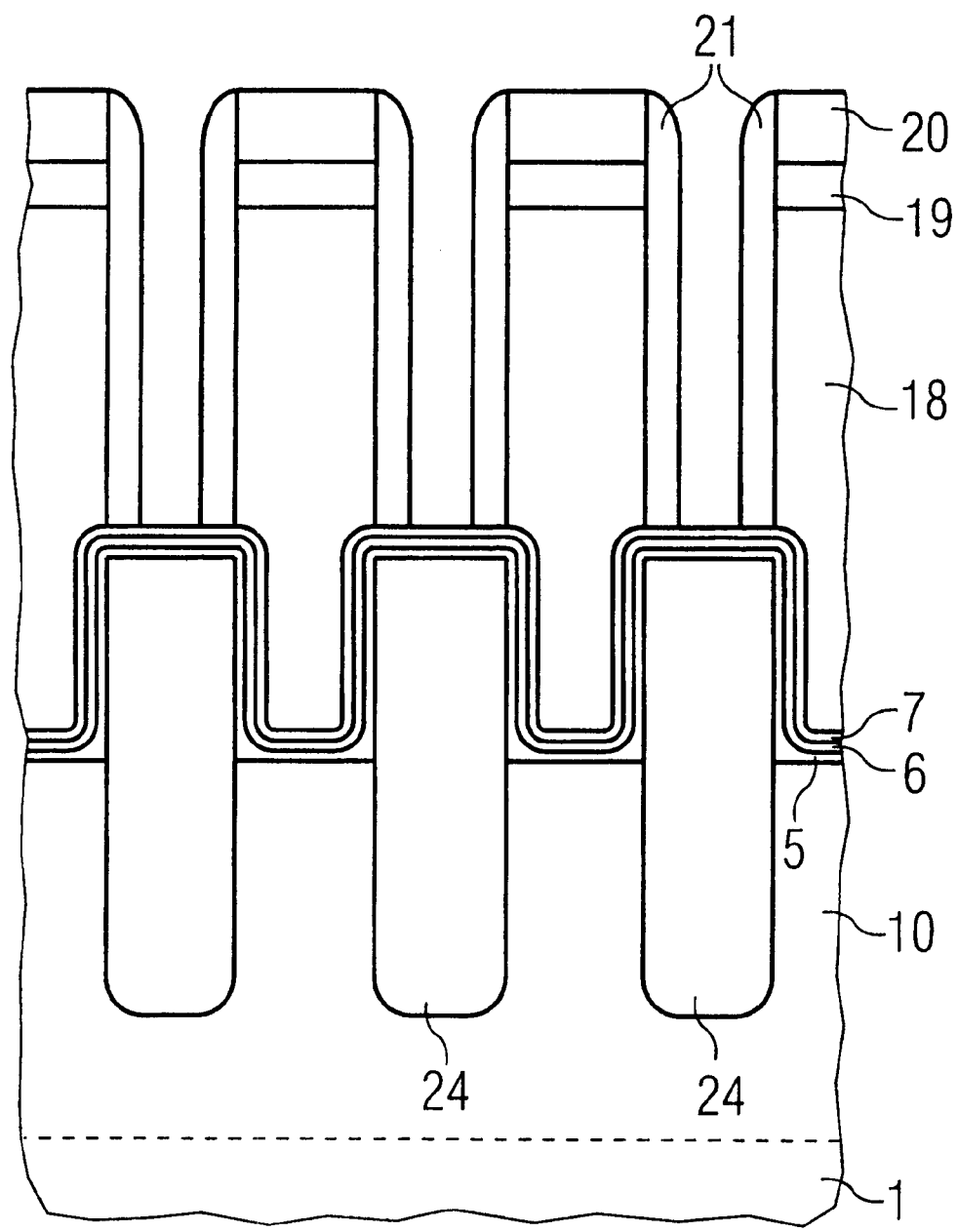
FIG 4.2c

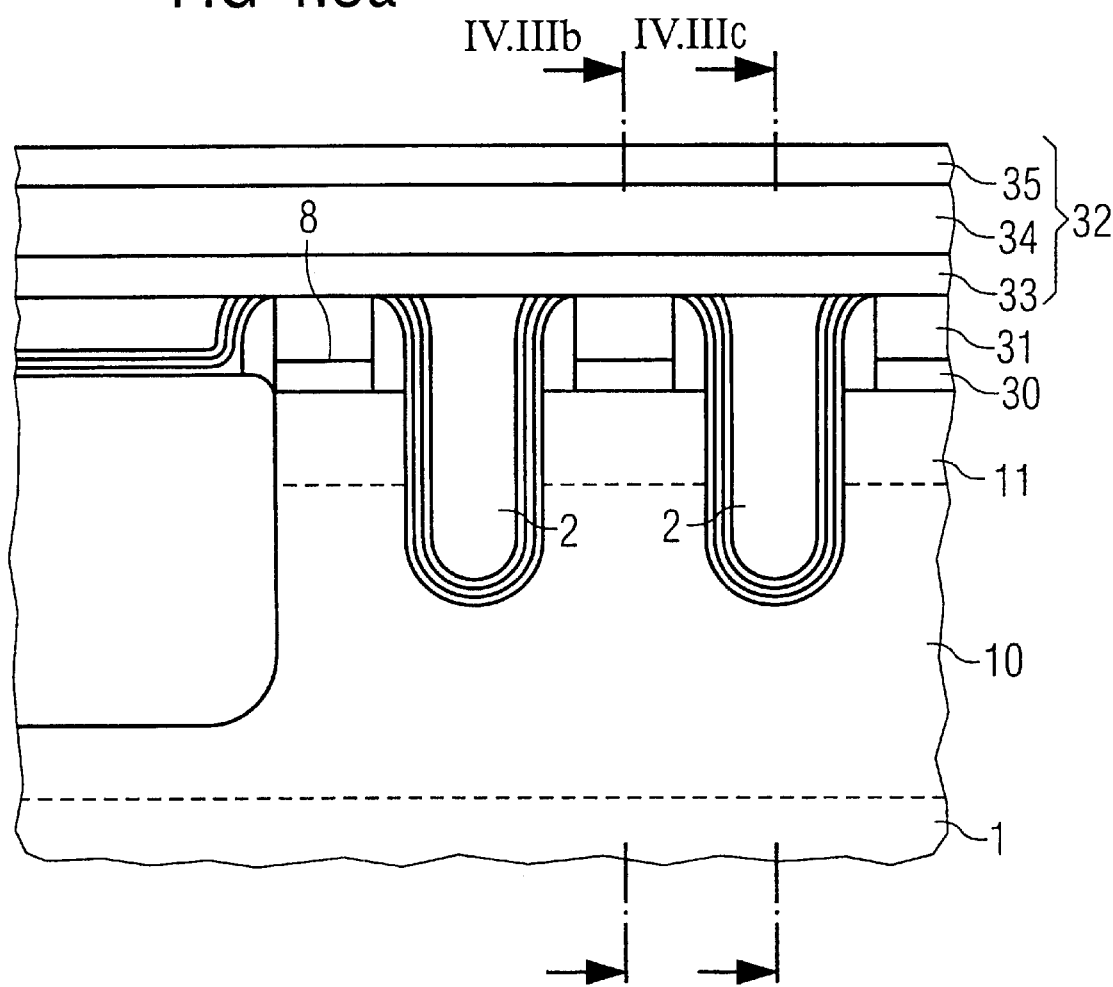
FIG 4.3a

FIG 4.3b
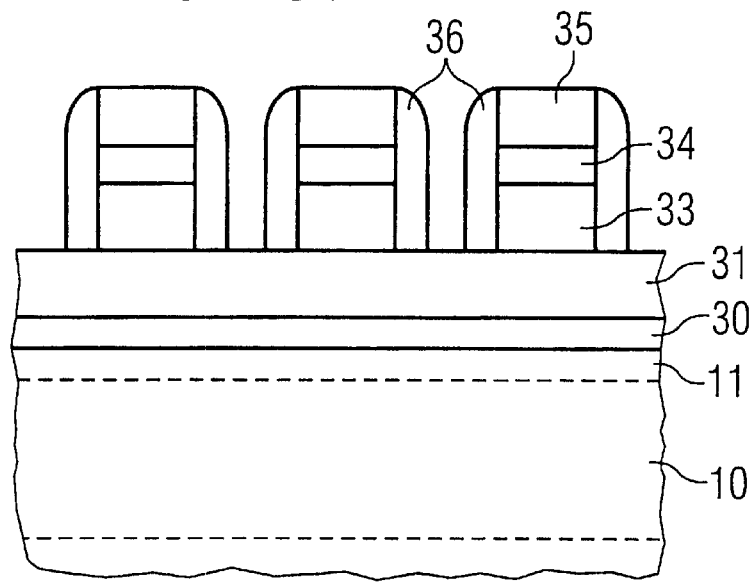
FIG 4.3c
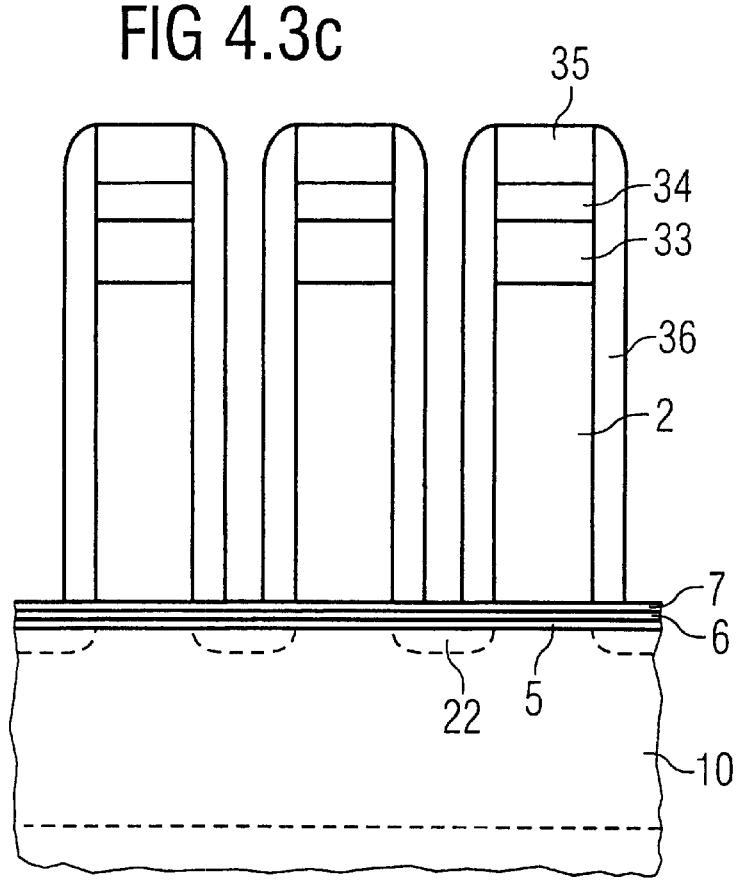

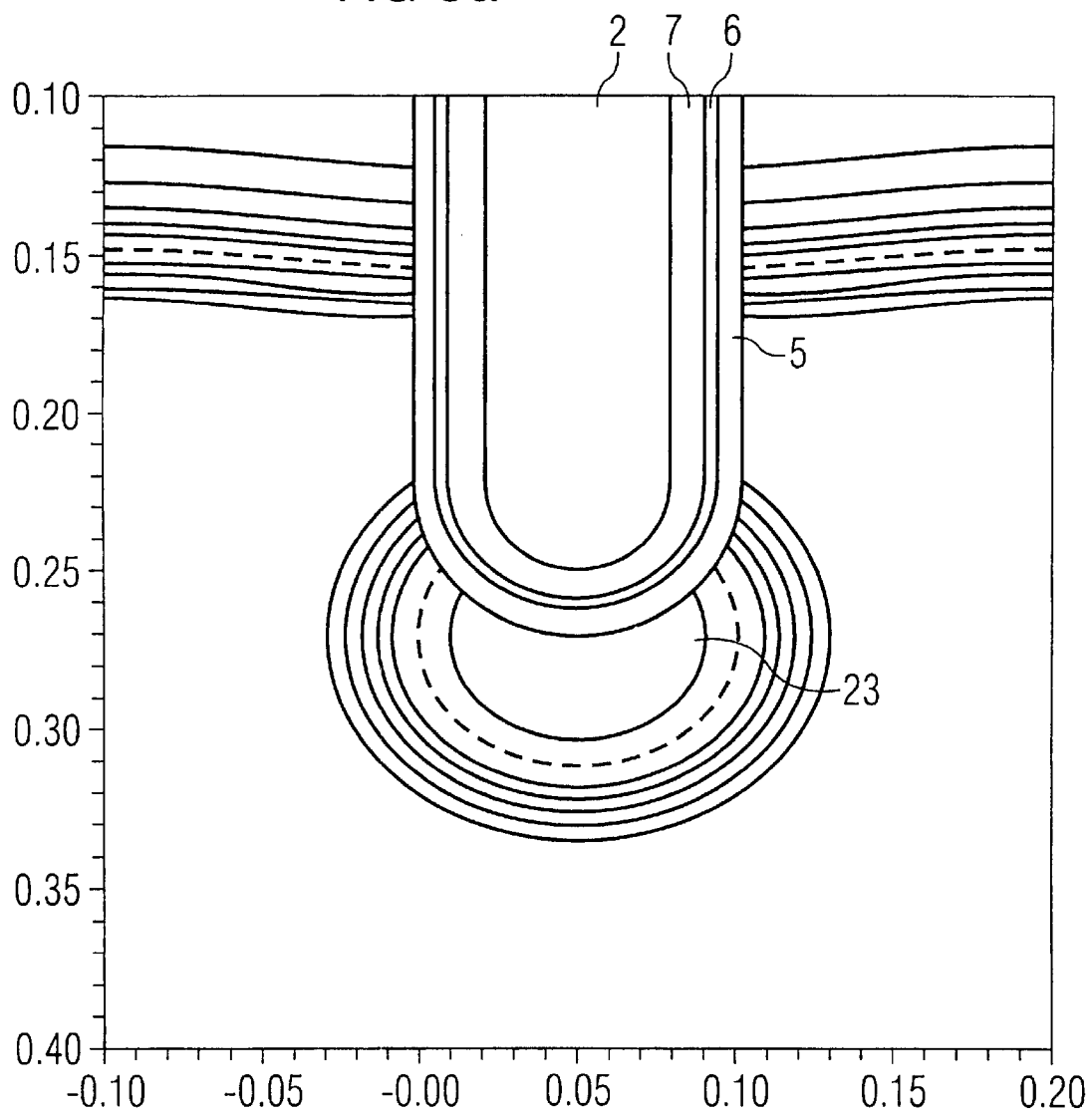

MEMORY CELL, MEMORY CELL ARRANGEMENT AND FABRICATION METHOD

BACKGROUND OF THE INVENTION

Field of the Invention

The invention relates to the field of electrically writable and erasable non-volatile flash memories. It describes a non-volatile memory cell which is constructed in accordance with the SONOS principle (semiconductor-oxide-nitride-oxide-semiconductor) and can be used in a virtual-ground NOR architecture.

Extremely small non-volatile memory cells are required for very large scale integration densities for multimedia applications. Ongoing development in semiconductor technology allows increasingly large storage capacities, which will very soon reach the gigabit range. However, while the minimum feature size, which is determined by lithography, continues to decrease, other parameters, such as for example the thickness of the tunnel oxide, can no longer be scaled accordingly. The associated reduction in the channel length in planar transistors with smaller features requires an increase in the channel doping, in order to avoid the occurrence of a punch-through between the source and the drain. This leads to an increase in the threshold voltage, which is usually compensated for by a reduction in the thickness of the gate oxide.

However, planar SONOS memory cells which can be programmed by channel-hot electrons and can be erased using hot holes (cf. Boaz Eitan U.S. Pat. Nos. 5,768,192, 6,011,725, WO 99/60631) require a control dielectric with a thickness which is equivalent to a gate oxide. However, this thickness cannot be reduced as desired without the number of program cycles which can be executed (the endurance of the memory cell) falling unacceptably. Therefore, a sufficiently great channel length to ensure that the dopant concentration in the channel does not have to be selected to be excessively high is required, since otherwise the threshold voltage rises too greatly.

The publication by J. Tanaka et al.: "A Sub-0.1 $\mu$m Grooved Gate MOSFET with High Immunity to Short-Channel Effects" in IEDM 93, pp. 537–540 (1993) describes a transistor on a $p^+$ substrate, in which the gate electrode is arranged in a trench between the $n^+$-source region and the $n^+$-drain region, so that in this way a curved channel region is formed in the substrate.

The publication by K. Nakagawa et al.: "A Flash EEPROM Cell with Self-Aligned Trench Transistor & Isolation Structure" in 2000 IEEE Symposium on VLSI Technology Digest of Technical Papers describes a transistor as a memory cell with a floating-gate electrode, which is arranged between the $n^+$-source region and the $n^+$-drain region, extending into a p-well of the substrate. Between the floating-gate electrode and the control-gate electrode there is a dielectric layer of an oxide-nitride-oxide layer sequence.

Kamiya (U.S. Pat. No. 6,080,624) describes a non-volatile semiconductor memory with flash EEPROM memory cells. The gate dielectric, a floating-gate electrode which is provided as a storage medium, an ONO film as intermediate dielectric, a control gate electrode and a nitride film provided as a covering layer are applied to a substrate and are patterned. The source regions and the drain regions are formed by introduced diffusion. A further nitride layer is applied to the entire surface, and an electrical insulator is introduced into the spaces which are present between the webs of the gate electrodes. The insulating strips which are formed in this way run in the direction of the word lines, while the bit lines are formed by electrical conductor tracks applied to the top side.

DE 195 45 903 A1 has disclosed a read-only memory cell arrangement, in which planar MOS transistors are arranged in rows running parallel to one another. Adjacent rows alternately run along the bottom of longitudinal trenches and on webs which are present between adjacent longitudinal trenches. Accordingly, lower source/drain regions are formed on the bases of the longitudinal trenches, and upper source/drain regions are formed on the top sides of the webs which are present between the trenches. Dielectric layers are arranged on the source/drain regions as gate dielectrics, and these are supplemented, at the walls of the longitudinal trenches, by spacers comprising $SiO_2$. An ONO layer sequence may be provided as the gate dielectric. The bit lines run transversely to the longitudinal trenches, and the word lines run parallel to the longitudinal trenches.

It is an object of the present invention to describe a memory cell for a memory cell arrangement which requires an extremely small surface area and to describe an associated fabrication method.

The memory cell according to the invention is based on the discovery that it is only possible to further reduce the dimensions of the memory cells while at the same time maintaining a sufficiently low access time for writing and reading if the bit lines have a sufficiently low resistance. For this purpose, the bit lines are formed as a result of a separate layer or layer sequence, which is patterned in strip form in accordance with the bit lines, is connected in an electrically conductive manner, in particular as a metallization, to the source/drain regions and reduces the resistance of the bit lines, being arranged on doped source/drain regions of memory transistors. This layer or layer sequence is in very general terms a layer or layer sequence which is designed in the form of strips and comprises at least one layer film which has a sufficiently low resistance for the intended purpose, irrespective of whether this layer or layer sequence is formed completely or only in a partial layer film of electrically conductive material. In the description which follows and in the claims, an electrically conductive layer or layer sequence of this type which extends at least in one layer film is in each case referred to as an electrically conductive layer. In particular, at least one material selected from the group consisting of doped polysilicon, tungsten, tungsten silicide, cobalt, cobalt silicide, titanium and titanium silicide is suitable for this purpose.

If the source/drain regions are formed from silicon, the metallization may preferably be a silicided metal layer which is fabricated using the method known as "salicide", which represents a contraction of self-aligned silicide. In other embodiments, preferably likewise on silicon, a layer sequence, which is applied as metallization, comprising polysilicon and WSi or WN/W, as well as a covering and electrically insulating layer made from a material which is suitable for a hard mask, for example an oxide or nitride, is present on the source/drain regions of the memory transistors. The metallizations of the bit line structures are patterned directly on the substrate and, if required, partially over oxide-covered regions.

The source/drain regions of the individual memory transistors are fabricated using a high-dose source/drain implantation or by diffusion of dopant out of a suitable layer, e.g. out of polysilicon. The strip-like metallizations which are applied to the source/drain regions form the bit lines which, on account of the good conductivity of the metallizations, have a particularly low resistance. In this context, the term metallization is to be understood as meaning a metal-containing layer or a conductor track which at least has metal-like properties. The source/drain regions of the same bit line do not have to be connected to one another in an electrically conductive manner as early in the semiconductor material. Preferably, however, the bit lines are designed as buried bit lines with strip-like doped regions in the semiconductor material, which are additionally provided with the metallizations.

On the top side, which is remote from the semiconductor material, the bit line structures are preferably encapsulated in nitride layers, which are designed as strips and, in the fabrication method, serve as an etching mask for the production of channel regions of the transistors which are self-aligned with respect thereto. After a memory layer, which preferably comprises a layer sequence formed from a boundary layer, a memory layer and a further boundary layer and is formed in the manner of an ONO layer, has been applied, a layer sequence for the fabrication of word lines is deposited and is preferably patterned in strip form by dry etching.

The boundary layers are made from a material with a higher energy band gap than the energy band gap of the memory layer, so that the charge carriers which are trapped in the memory layer remain located there. A material which is preferably suitable for the memory layer is a nitride; an oxide is particularly suitable as surrounding material. In the case of a memory cell using the silicon material system, the memory layer, in the example of an ONO layer sequence, is silicon nitride with an energy band gap of approximately 5 eV; the surrounding boundary layers are silicon oxide with an energy band gap of approximately 9 eV. The memory layer may be a different material whose energy band gap is smaller than the energy band gap of the boundary layers, in which case the difference between the energy band gaps should be sufficiently great to ensure good electrical confinement of the charge carriers. In combination with silicon oxide as boundary layers, the material used for the memory layer may, for example, be tantalum oxide, hafnium silicate, titanium oxide ($TiO_2$ in the case of a stoichiometric composition), zirconium oxide ($ZrO_2$ in the case of a stoichiometric composition), aluminum oxide ($Al_2O_3$ in the case of a stoichiometric composition) or intrinsically conductive (undoped) silicon.

Electrical isolation can be produced between the channel regions of the transistors of adjacent memory cells, by implantation of dopant with a variable angle of incidence, in order to isolate the transistors from one another, known as anti-punch implantation. An alternative configuration provides for this isolation to be produced by recesses which are filled with oxide; this takes place in the manner of an STI (shallow trench isolation).

A memory cell of this type makes it possible, despite having a sufficiently great gate length of the memory transistors, to produce the respective memory cell as a minimum possible crosspoint cell on the scale of the photolithography used. The structure according to the invention allows large cell blocks with a minimum drive periphery, resulting in a high cell efficiency. The memory cell structure which is formed in accordance with the invention can also be used to produce bit line structures which are arranged especially above STI structures.

There now follows a more thorough description of the memory cell according to the invention and associated fabrication methods, with reference to the examples illustrated in the appended figures.

BRIEF DESCRIPTION OF THE DRAWINGS

FIGS. 1, 2a, 2b, 3, 4a, 4b and 4c show cross sections through intermediate products for the memory cell after various steps of a preferred fabrication method.

FIGS. 4.1 and 4.11 show the view shown in FIG. 4a for in each case one alternative exemplary embodiment.

FIGS. 4.2b and 4.2c show the views shown in FIGS. 4b and 4c for an alternative exemplary embodiment.

FIGS. 3.3a, 3.3b and 3.3c show intermediate products from method steps of an alternative exemplary embodiment replacing FIG. 3.

FIGS. 4.3a to 4.3c correspond to FIGS. 4a to 4c for a further exemplary embodiment.

FIGS. 5a and 5b show diagrams for model calculations.

DESCRIPTION OF THE PREFERRED EMBODIMENTS

Figure 0:
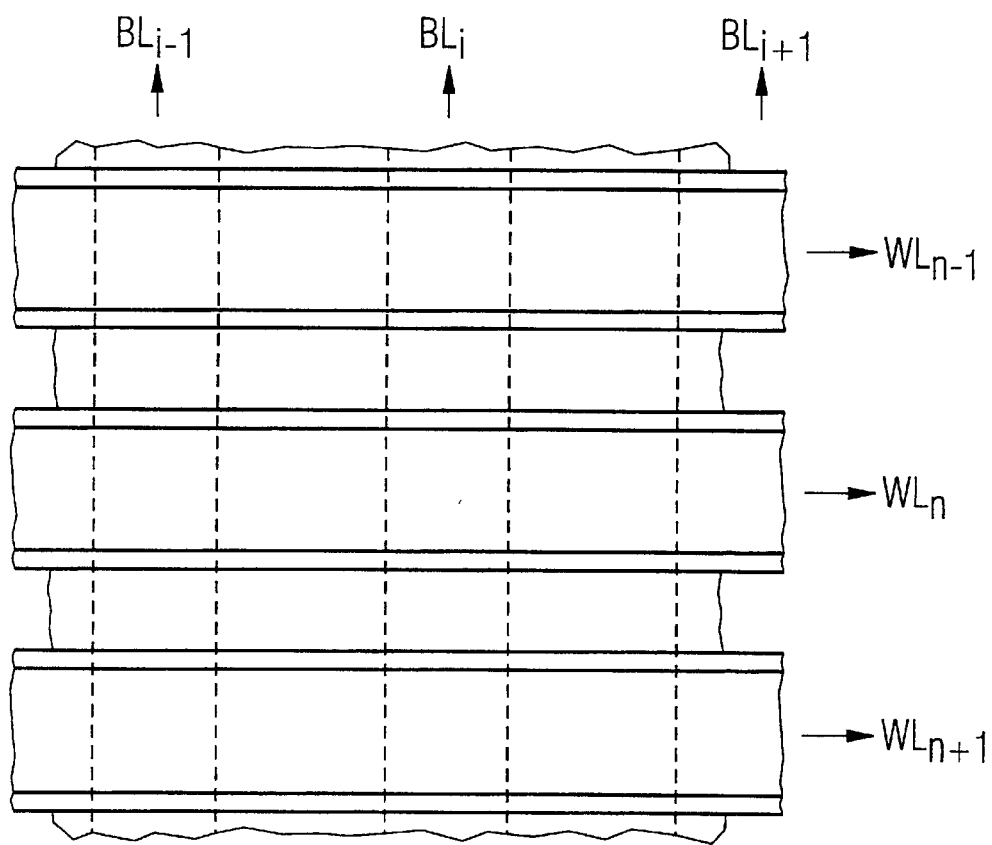
FIG. 0 shows a diagrammatic arrangement of the word lines and bit lines, in plan view.

FIG. 0 illustrates an arrangement of word lines $WL_{n-1}$, $WL_n$, $WL_{n+1}$ and bit lines $BL_{i-1}$, $BL_i$, $BL_{i+1}$, in a diagrammatic plan view. The bit lines are in this case in the form of buried bit lines and are indicated as covered contours using dashed lines. The word lines are arranged on the top side of the arrangement, preferably as metallic conductor tracks. A memory cell of the memory is in each case arranged at a crosspoint of a bit line intermediate region and a word line. This is the origin of the term crosspoint cell which is customarily employed for the smallest possible memory cell which can be used. In each case one memory cell according to the invention is situated at such a crosspoint of a memory cell arrangement. The memory cell which is in each case to be read or programmed is addressed in the manner known per se using the bit lines and word lines. All the memory cells together, in combination with the connections through bit lines and word lines illustrated, form a memory in the virtual-ground NOR architecture. In principle, however, the memory cell according to the invention can also be employed in other memory architectures. The structure of the memory cell in the memory cell arrangement of the memory is described below with reference to preferred fabrication methods.

Figure 1:
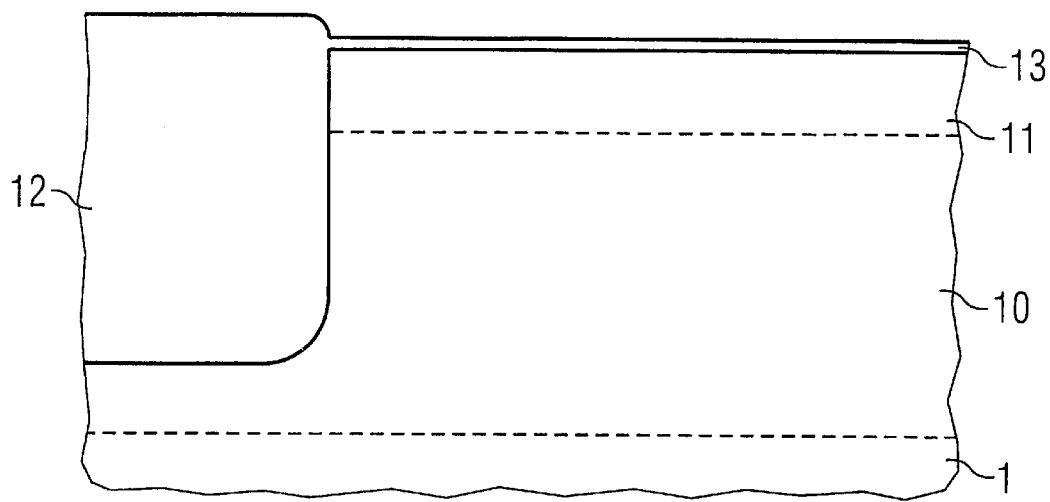

FIG. 1 shows a cross section through a first intermediate product for the purpose of explaining the memory cell structure according to the invention and its arrangement in a memory cell field on the basis of a preferred fabrication method. The fabrication preferably forms part of a CMOS process which is also used to produce the drive electronics. For this purpose, trenches are etched in a semiconductor body or in a semiconductor layer or semiconductor layer sequence which is grown on a substrate and are filled with an oxide as STI (shallow trench isolation). It is customary for the top side of the semiconductor material initially to be covered with a pad oxide and pad nitride, which is known per se. The STI trench etching takes place using a suitable photographic technique. After the oxide filling has been introduced, the top side is planarized, which can be achieved, for example, in a manner known per se by means of CMP (chemical mechanical polishing). The pad nitride is then removed by etching. P-wells and n-wells, i.e. doped regions which extend deep into the semiconductor material and which are provided for the drive periphery and for memory cells, when using silicon as the semiconductor material, are preferably fabricated using masked boron implant ions and phosphorus implant ions with subsequent annealing of the implants. FIG. 1 also shows, in a semiconductor body 1, e.g. a silicon substrate, a p-well 10 which is formed and an edge isolation 12, which is produced, for example, using an oxide, in cross section.

Following the removal of the pad oxide which was initially applied, an oxide layer 13 of suitable thickness is grown on and subsequently serves as an etching stop layer outside the memory cell field. In this exemplary embodiment of the fabrication process, a suitable photographic technique is then used to introduce implantation (e.g. phosphorus), by means of which a region 11 which is doped to be highly n-conducting ($n^+$-region) is formed in an upper section of the p-well 10, this region being provided for the source/drain regions which are subsequently to be fabricated. The signs of the doping may also be reversed ($p^+$-region in an n-well). In the region of the memory cell field, preferably the same photomask is used to remove the oxide layer 13 which is not required for the formation of the memory cell by wet-chemical means.

Figure 2A:
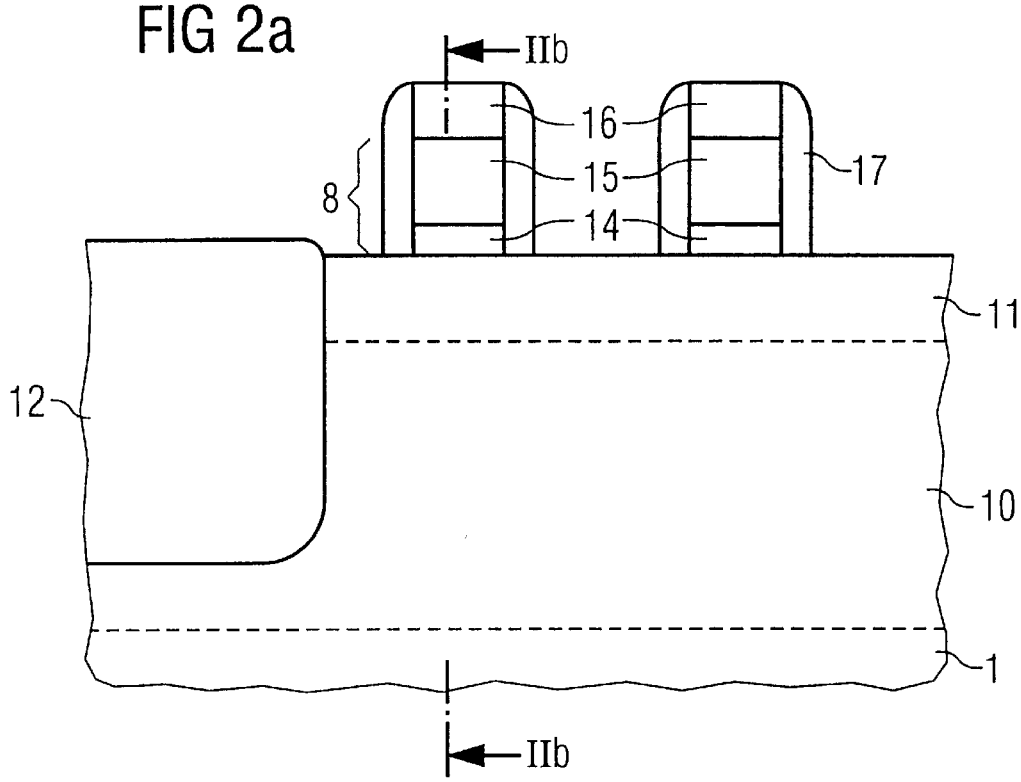

FIG. 2a shows the cross section illustrated in FIG. 1 after the application and patterning of a further layer sequence. This layer sequence is used to form the electrically conductive layer 8 patterned in strip form, which is pertinent to the invention, of the bit line structures. In the exemplary embodiment illustrated in FIG. 2a, in a preferred embodiment, for this purpose, first of all a polysilicon layer 14 of the associated sign of conductivity type, followed by a metal-containing layer 15, in this case of tungsten silicide (WSi), as the actual low-resistance bit line, and then a material of a hard mask 16 (e.g. an oxide) for electrical isolation are applied in order to make contact with the source/drain regions and are patterned in strip form. Instead of the WSi, a layer sequence of tungsten nitride and tungsten may be applied. The electrically conductive layer may also include titanium and/or titanium silicide. The patterning of the electrically conductive layer 8 in strip form preferably takes place using a photographic technique and anisotropic etching; the question of whether the semiconductor material of the semiconductor body or the semiconductor layer of the implanted region is etched slightly is irrelevant. The strip-like sections of the electrically conductive layer 8 are isolated at the sides by spacers 17, preferably made from a oxide.

Figure 2B:
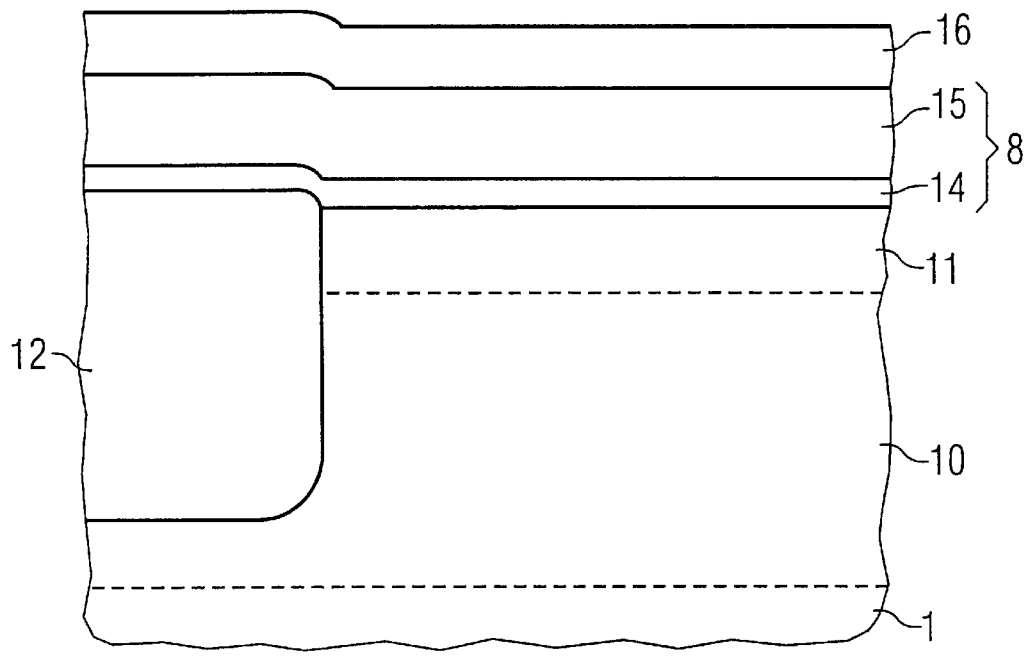

FIG. 2b illustrates the section shown in FIG. 2a. It can be seen from this figure that the electrically conductive layer 8, which in this exemplary embodiment comprises a polysilicon layer 14 and a metal-containing layer 15, which if desired may also be multilayered, is extended laterally beyond the edge isolation 12. The etching for the purpose of the strip-like patterning of these layers is delimited at the edge of the cell field by the oxide of the edge isolation 12. The bit lines, which end with their buried section at the edge isolation 12, are extended beyond the edge isolation 12 by the sections of the electrically conductive layer which have been patterned in strip form and contact can therefore be made with the bit lines outside the actual memory cell field.

With the bit line structures on the top side and the oxide-covered regions as a mask, trenches 28 are, as illustrated in FIG. 3, etched in a self-aligned manner (e.g. by means of reactive ion etching, RIE), these trenches being provided for the active regions, in particular the individual memory cells. The source/drain regions 3, 4 are formed between them. Moreover, it should be taken into account that, to achieve a good performance, the charge carrier concentration which is in each case present at a defined gate voltage in a section 23 of the channel region of the memory transistor which is provided at the base of the trench must be sufficiently high; in the case of a p-well, this concentration is the electron concentration. In an advantageous configuration, in which the well 10 of the memory cell has a typical dopant concentration of $10^{17}$ cm$^{-3}$, therefore, the dopant concentration of the channel region is changed to a greater extent in the center than in the laterally outer regions, by implantation in that section 23 of the channel region which is provided at the base of the trench. For this purpose, it is preferable initially to apply a sacrificial layer (e.g. sacrificial oxide, typically approximately 6 nm thick, thermally produced). Then, the designated dopant is implanted; in the example cited of a p-doped well, this is arsenic as dopant with an energy of, for example, typically 20 keV, in a quantity of $10^{12}$ cm$^{-2}$ to $10^{14}$ cm$^{-2}$. The sacrificial layer is removed; in the case of an oxide, this can take place using dilute HF.

A layer sequence comprising a lower boundary layer 5, a memory layer 6 and an upper boundary layer 7 is applied to the entire surface. This layer sequence is provided as the actual storage medium and, as described in the introduction, may, for example, be an ONO layer sequence which is known per se. In this case, the lower boundary layer 5, may, for example, be an oxide which is approximately 2.5 nm to 8 nm thick (bottom oxide, preferably thermally produced), the memory layer 6 may be a nitride which is approximately 1 nm to 5 nm thick (preferably deposited by means of LPCVD, low pressure chemical vapor deposition), and the upper boundary layer 7 may likewise be an oxide, approximately 3 nm to 12 nm thick.

The structure which can be achieved in this way is illustrated in cross section in FIG. 3. The memory cell field is covered by means of a suitable photographic technique, so that in the region of the periphery the memory layer including the boundary layers can be removed. The memory layer may also be removed in the region of the memory at the bottoms of the trenches 28 provided for the gate electrodes and/or between the trenches 28, so that the memory layer is interrupted between the walls of a respective trench and/or between two adjacent trenches. Then, for the drive periphery, first of all the gate oxide for high-voltage transistors and then, if appropriate, a thinner gate oxide for low-voltage transistors are grown on. The threshold voltages can be adjusted using further masks and implantations.

The cross section illustrated in FIG. 4a shows the structure following the deposition of a conductively doped polysilicon layer 18, which is provided for the gate electrodes 2, and of a metal-containing layer 19 (in this case WSi), which is provided for the word line, and of a hard mask layer 20. The polysilicon is deposited in a thickness of typically 80 nm and is preferably doped in situ and is provided for the gate electrodes. The actual word lines are formed by the low-resistance, metallic or metal-containing material of the metal-containing layer 19. Instead of tungsten silicide, it is possible for there to be a silicide of a different metal or a multilayer metal-containing layer. The material of the hard mask layer 20 is, for example, a compressed oxide.

Figure 4B:
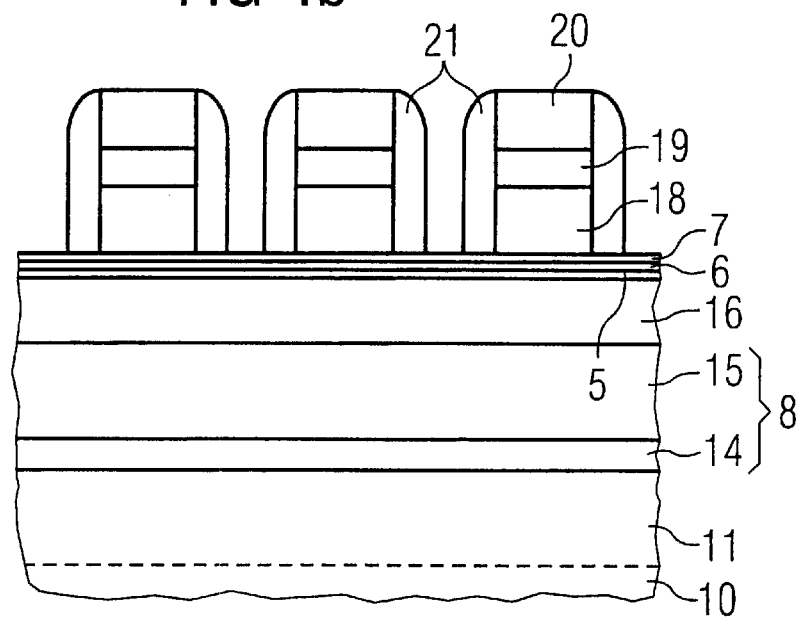
Figure 4C:
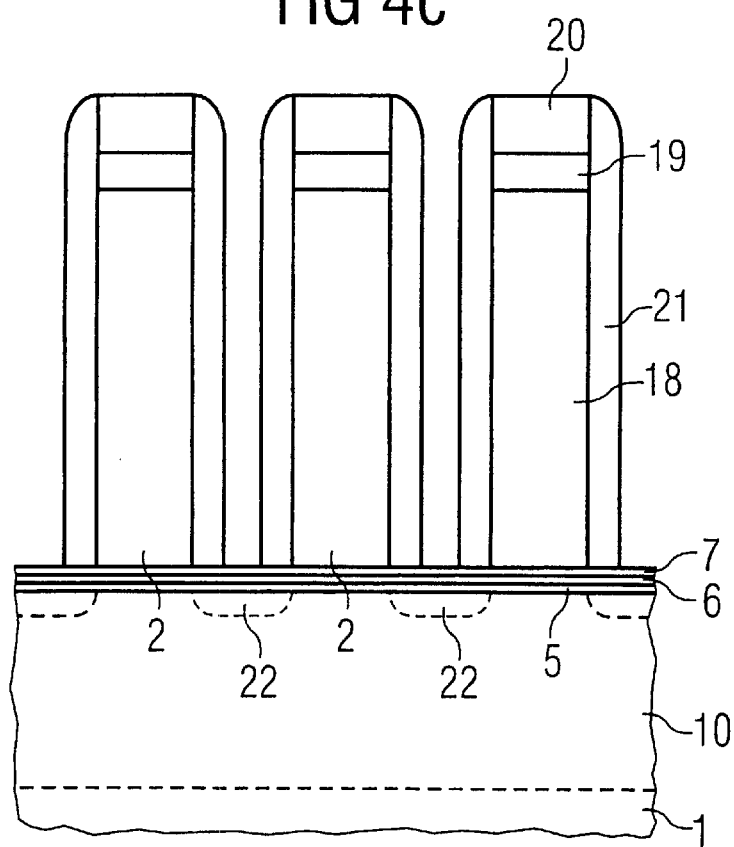

The sectional views which are drawn in FIG. 4a are illustrated in FIG. 4b and FIG. 4c. In the cross section shown in FIG. 4b, the layer sequence of the memory layer 6 between the boundary layers 5, 7 is situated above the strip-like electrically conductive layer 8 which is provided for the bit lines and in this example is formed from the polysilicon layer 14 and the metal-containing layer 15 and, isolated from this, through the hard mask 16. In the position of the section through the gate electrodes 2 between two strip-like sections of the electrically conductive layer of the bit lines, which can be seen in FIG. 4c, the memory layer 6 runs at the bottom of the trenches which are provided for the gate electrodes. The layer sequence which is applied, comprising the polysilicon layer 18, the metal-containing layer 19 and the hard mask layer 20, is patterned in strip form, as can be seen from FIGS. 4b and 4c, so that word lines running transversely with respect to the bit lines are formed. The flanks of the word lines are isolated by spacers 21. The spacers are formed in a manner which is known per se by applying a layer consisting of the same material as the spacers, preferably an oxide, isotropically to the entire surface and etching it back anisotropically, so that substantially only the high vertical sections of the spacers 21 remain on the flanks of the word lines which have been etched in strip form. The spaces between the gate electrodes and below the word lines may instead be left completely or partially filled with the material of the spacers.

In this method step, the gate electrodes of the transistors of the drive periphery may be patterned simultaneously. In the region of the memory cell field, the etching of the gate electrodes stops at the upper boundary layer 7 or the ONO layer sequence. It is additionally possible for gate reoxidation to be carried out and, depending on requirements, to introduce an anti-punch implantation 22 for isolation of adjacent transistors.

Further conventional method steps which are known per se for the fabrication of the transistors may equally well be provided, such as for example LDD (lightly doped drain) implantations and HDD implantations or deposition of a passivating layer of nitride and planarizing by means of BPSG (boron-doped phosphosilicate glass) and CMP. Further steps for completion consist in the fabrication and filling of via holes and in the fabrication of metallizations and passivating layers. These fabrication steps are known per se from the fabrication of memory components.

FIG. 4.1 illustrates an alternative configuration, in which the bit line implantation for forming the buried bit lines is completely or partially replaced by diffusion out of the material which has been applied thereto. This means that, with this type of fabrication, the implantation for the fabrication of the doped region 11 which is provided for source and drain can also be omitted. The electrically conductive layer 8 is then applied in such a way that a dopant can diffuse at least out of a bottom layer section, in the example described the doped polysilicon layer 14, into the semiconductor material of the semiconductor body 1 or of the semiconductor layer. In this way, the source/drain regions 110, which are indicated by dashed boundaries in FIG. 4.1, are formed. Moreover, in a preferred configuration, the well of the memory cell is modified by implantation into that section 23 of the channel region of the memory transistor which is arranged at the bottom of the trench in such a way that the dopant concentration of the channel region is changed to a greater extent in the center than in the lateral, outer regions. This takes place in a similar way to that which has been described above with reference to FIG. 3.

FIG. 4.11 shows a further exemplary embodiment, in which, prior to the fabrication of the spacers 17, an implantation of dopant for the sign of the conductivity type of source and drain is introduced, in order to fabricate the source/drain regions 3a, 3b, 4a, 4b which in this example are predominantly formed adjacent to the layer sequence comprising the memory layer 6 and the boundary layers 5, 7 in separate sections. In this case too, it is possible to provide for diffusion of dopant out of the polysilicon layer 14 for the purpose of forming the doped regions 111 in addition to the source/drain regions in one of the following heat-treatment steps. In this exemplary embodiment too, that section 23 of the channel region of the memory transistor which is arranged at the bottom of the trench is preferably modified by implantation in the manner described above.

FIGS. 4.2b and 4.2c show cross sections corresponding to FIGS. 4b and 4c for a further exemplary embodiment, in which additional isolation regions are present in the semiconductor material for the purpose of delimiting the memory cells from one another. This is because the way in which the channel regions are arranged extremely close together may lead to isolation problems between adjacent memory transistors. The process design which is disclosed here can be modified in such a way that adjacent memory cells are separated from one another using STI structures. For this purpose, narrow, deep trenches in the manner of the trenches provided for shallow trench isolation are etched into the semiconductor material between the word lines.

FIGS. 4.2b and 4.2c show cross sections through exemplary embodiments having isolation regions 24 of this type, preferably an oxide which may be fabricated, for example, by a combination of oxidation of silicon and deposition of $SiO_2$, FIG. 4.2b showing an area along a bit line and FIG. 4.2c showing an area between two bit lines. In this case, the etching out of the trenches which are provided for the gate electrodes stops at the isolation regions 24, so that in the transverse direction with respect to the word lines the memory layer 6 is applied, in the manner illustrated in FIG. 4.2c, substantially at two layer levels and on the flanks of the isolation regions 24. The fact that the etching of the trenches which are provided for the gate electrodes stops at the material of the isolation regions 24 means that the trenches are only formed in the spaces between the isolation regions 24. Therefore, between the channel regions of the memory transistors, there remains in each case one such isolation region 24, which separates these channel regions from one another. This does not cause any modifications to the remaining layer structure and the remaining patterning compared to the other exemplary embodiments.

The electrically conductive layer 8 which has been patterned in strip form in order to reduce the resistance of the bit lines can also be fabricated by metallization of the bit lines by means of a salicide (self-aligned silicide) method. This is explained with reference to the cross sections shown in FIGS. 3.3a to 3.3c. FIG. 3.3a illustrates the cross section which corresponds to that shown in FIG. 3. Unlike in the exemplary embodiment shown in FIG. 3, however, the electrically conductive layer is not applied directly to the region 11 which has been doped for source and drain, but rather initially only a patterning layer 25 made from a material which is suitable for a hard mask is applied to this doped region 11, and then this layer is patterned in strip form. This patterning layer is preferably laterally delimited by spacers 26, for example of oxide. The layer sequence of boundary layers 5, 7 and a memory layer 6 arranged between them, for example an ONO layer sequence, which is provided for the storage is, after the etching of the trenches 28 provided for the gate electrodes, applied to the entire surface in the manner described above. In the region of the transistors which are provided for the driving in the periphery of the memory cell field, the memory layer sequence may be removed and replaced by at least one gate oxide for the drive transistors.

As shown in FIG. 3.3b, the trenches 28 are filled with the material which is intended for the gate electrode 2, preferably doped polysilicon. There then follows a method step in which the top side of the arrangement is partially abraded and planarized, preferably by means of CMP. To ensure that this method step ends as uniformly as possible on the material of the patterning layer 25, the patterning layer is preferably formed from nitride. The memory layer 6 and the boundary layers 5, 7 are removed on the top side of the patterning layer 25. This makes the patterning layer accessible again from the top.

FIG. 3.3b illustrates the semiconductor body 1 with the p-well 10 formed therein, the doped region 11 for source and drain and the trenches, which are filled with the material of the gate electrodes 2, between strip-like sections of the patterning layer 25 which is laterally delimited by spacers 26. The top sides 27 of the patterning layer are exposed. In this case too, the implantation of the doped region 11 at the start can be omitted if the source/drain regions are fabricated subsequently through diffusion of dopant out of the material of the electrically conductive layer.

There then preferably takes place a thermal oxidation of the polysilicon of the gate electrodes, so that the thin oxidized regions 29 shown in FIG. 3.3c are formed on its top side, but the nitride of the patterning layer is only oxidized to an insignificant extent. This prevents subsequent siliciding of the gate electrodes. It is then possible for the patterning layer to be removed, although with the spacers 26 remaining in place. If the patterning layer has been formed from nitride and the spacers have been formed from oxide, the nitride of the patterning layer can be selectively removed with respect to the oxide of the spacers without problems. The semiconductor material is then exposed on the top side, in this example meaning the doped region 11 in the semiconductor body.

As third variant for the fabrication of the source/drain regions, in this exemplary embodiment it is also possible for the implantation for source and drain only to be carried out in a method step which follows the removal of the patterning layer 25. Since the application of the boundary layers and of the memory layer, in particular in the embodiment as an ONO layer sequence, requires a high-temperature process, there may otherwise also be diffusion of the dopant which has already been implanted and after the implantation is locally present in a high concentration. However, if the implantation is only carried out after the application of the ONO layer structure and after the removal of the patterning layer, this temperature-induced diffusion takes place only to a very limited extent.

Then, a metal layer 30, for example cobalt, is applied as electrically conductive layer 8 at the location of the strip-like sections of the patterning layer. In a preferred embodiment, silicon is used as the semiconductor body and the metal is converted by heat treatment into a silicide, in this case preferably cobalt silicide.

The further steps of the fabrication method of this exemplary embodiment are described with reference to FIGS. 4.3a to 4.3c, which correspond to FIGS. 4a to 4c of the exemplary embodiment described above. FIG. 4.3a shows a cross section parallel to the word lines 32 and perpendicular to the bit lines and the strip-like sections of the electrically conductive layer 8 on the buried bit lines. It can be seen from this FIG. 4.3a that initially the metal layer 30, which is provided in this case as electrically conductive layer 8, is covered with an electrically isolating layer 31, preferably an oxide. Then, a layer sequence for the word lines 32, which typically comprises, by way of example, a polysilicon layer 33, a metal-containing layer 34, in particular comprising a metal silicide, and a hard mask layer 35, is applied to the planar surface. The polysilicon layer may also be omitted. The metal-containing layer 34 may in particular be tungsten silicide or a double layer of tungsten nitride and metallic tungsten applied thereto. It is also possible for the word line used simply to be a polysilicon layer 33, to which the hard mask layer 35 is applied directly. The latter embodiment with polysilicon and hard mask without metal may be advantageous if a salicide method is to be employed repeatedly, for example for the transistors of the drive periphery. In FIG. 4.3a, the positions of the sections illustrated in FIGS. 4.3b and 4.3c are indicated.

It can be seen from FIG. 4.3c that the layer sequence 33, 34, 35 which is provided for the word lines is patterned in strip form and is isolated at the flanks by spacers 36. The ONO layer sequence has been removed in this region of the component. The way in which the layer sequence of the word lines which is patterned to form strips is applied to the material of the gate electrodes 2 can also be seen. In this exemplary embodiment, the spacers 36 may also completely or partially fill up the space between the word lines. The anti-punch implantation 22 which has already been described with reference to FIG. 4c is also incorporated in the example illustrated in FIG. 4.3c. The patterning of the gate electrodes 2 along the word lines preferably takes place together with the patterning of the layer sequence which is provided for the word lines 32. The further layer structure is produced in a similar manner to the exemplary embodiments described above. The transistors of the drive periphery are produced in accordance with the CMOS processes which are known per se.

In the preferred exemplary embodiments, as stated above, a defined dopant concentration is set in the base of the trench, in particular by implantation. FIG. 5a shows a diagram relating to a model calculation, in which the lateral dimension in the plane of the drawing shown in FIG. 3 or 4.1 is plotted in $\mu$m on the abscissa, and the distance d from the top side of the semiconductor body or a defined layer film within the semiconductor body is plotted in um on the ordinate. Lines of identical dopant concentrations for a typical exemplary embodiment are shown in the region of the semiconductor material of the trench base.

Figure 5B:
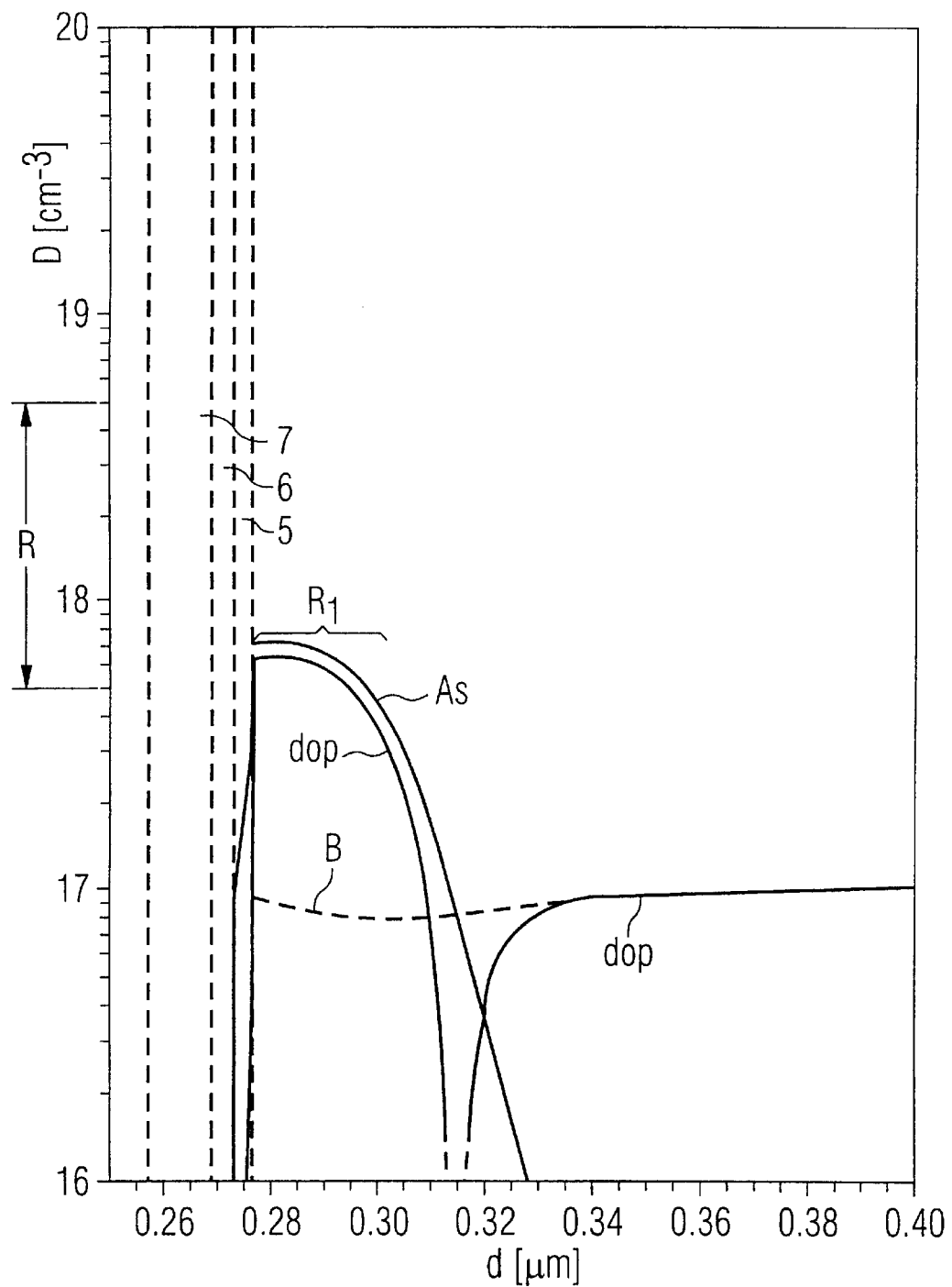

In the associated FIG. 5b, the respective ordinate value d/$\mu$m from FIG. 5a is plotted on the abscissa. The dopant concentration D in $cm^{-3}$ (number of dopant atoms per cubic centimeter) is plotted on the ordinate. The vertical dashed lines mark the boundaries between the boundary layers 5, 7 and the memory layer 6. The graphs for the dopant concentrations of arsenic and boron are shown as continuous and dashed lines, respectively. In this example, the boron concentration remains constant at $10^{17}$ $cm^{-3}$, ideally remains constant at $2 \cdot 10^{17}$ $cm^{-3}$, or may also be $3 \cdot 10^{17}$ $cm^{-3}$; however, it is weakened slightly through diffusion of boron atoms into the dielectric of the boundary layer 5 in the region of the abscissa value around approximately 0.3 $\mu$m. In the preferred exemplary embodiments, below the lower boundary layer 5, an arsenic dopant concentration of $5 \cdot 10^{17}$ $cm^{-3}$ to $5 \cdot 10^{18}$ $cm^{-3}$ is set in a region below the deepest point of the trench base, which extends up to 20 nm deep into the semiconductor material (dimension $R_1$ in FIG. 5b). This can be achieved in particular by arsenic implantation with a dose of typically approximately $2 \cdot 10^{12}$ $cm^{-2}$ at an energy of 20 keV (using, as has already been indicated above, a pad oxide with a thickness of approximately 6 nm, which is subsequently to be removed). The range R of the dopant concentrations set in this way is marked on the ordinate in FIG. 5b.

With a boron concentration which is higher by a defined factor than the base doping of the semiconductor material or than well doping, the limits indicated for the arsenic concentration are to be multiplied by this factor. Therefore, in the section 23 of the channel region which is located at that section of the base of the trench which projects furthest into the semiconductor material or in the center of a base of the trench, and extends 20 nm vertically into the semiconductor material with respect to the base of the trench, a dopant concentration is established which lies in a range whose limits are determined by $5\cdot10^{17}$ cm$^{-3}$ and $5\cdot10^{18}$ cm$^{-3}$, in each case multiplied by a quotient from a concentration of a dopant which in this region is introduced into the semiconductor material as base doping or well doping, measured in cm$^{-3}$, and the value $10^{17}$ cm$^{-3}$. Dopants other than those indicated may also be suitable, provided that the conductivity types produced in this way in each case have the appropriate sign.

What is claimed is:

1. A memory cell, comprising:
   a semiconductor body having semiconductor material and a top side;
   a memory transistor having a gate electrode configured on said top side of said semiconductor body, said memory transistor having a source region and a drain region that are formed in said semiconductor material;
   a trench that is formed in said semiconductor body between said source region and said drain region, said gate electrode being configured in said trench;
   a layer sequence including boundary layers and a memory layer located between said boundary layers, said layer sequence being configured at least between said source region and said gate electrode and at least between said drain region and said gate electrode;
   a portion of a bit line formed by an electrically conductive layer patterned in a strip on said source region; and
   a portion of a bit line formed by an electrically conductive layer patterned in a strip on said drain region.

2. The memory cell according to claim 1, wherein said electrically conductive layer on said source region and said electrically conductive layer on said drain region include at least one material selected from the group consisting of doped polysilicon, tungsten, tungsten silicide, cobalt, cobalt silicide, titanium, and titanium silicide.

3. The memory cell according to claim 2, wherein said boundary layers are made of oxide.

4. The memory cell according to claim 1, wherein said boundary layers are made of oxide.

5. The memory cell according to claim 4, wherein said memory layer is made of a material selected from the group consisting of undoped silicon, tantalum oxide, hafnium silicate, titanium oxide, zirconium oxide, and aluminum oxide.

6. The memory cell according to claim 1, comprising:
   a channel region;
   said trench being formed with a base having a section that projects furthest into said semiconductor material;
   said channel region having a section that extends 20 nm vertically into said semiconductor material with respect to said base of said trench;
   said section of said channel region being located near said section of said base;
   said semiconductor material having a concentration of a dopant introduced therein; and said section of said channel region having a dopant concentration in a range having limits determined by $Y*5*10^{17}$ cm$^{-3}$ and $Y*5*10^{18}$ cm$^{-3}$, where Y is a quotient obtained from $10^{17}$ cm$^{-3}$ and the concentration, in cm$^{-3}$, of said dopant in said semiconductor material.

7. A configuration, comprising:
   a plurality of memory cells;
   each one of said plurality of said memory cells including:
   a semiconductor body having semiconductor material and a top side;
   a memory transistor having a gate electrode configured on said top side of said semiconductor body, said memory transistor having a source region and a drain region that are formed in said semiconductor material;
   a trench that is formed in said semiconductor body between said source region and said drain region, said gate electrode being configured in said trench;
   a layer sequence including boundary layers and a memory layer located between said boundary layers, said layer sequence being configured at least between said source region and said gate electrode and at least between said drain region and said gate electrode;
   a portion of a bit line formed by an electrically conductive layer patterned in a strip on said source region; and
   a portion of a bit line formed by an electrically conductive layer patterned in a strip on said drain region; and
   a plurality of word lines selected from the group consisting of metal-containing layers and layer sequences;
   said gate electrode of each one of said plurality of said memory cells being connected to one of said plurality of said word lines;
   said source region of one of said plurality of said memory cells serving as said drain region of an adjacent one of said plurality of said memory cells; and
   said drain region of said one of said plurality of said memory cells serving as said source region of another adjacent one of said plurality of said memory cells.

8. The configuration according to claim 7, wherein:
   said semiconductor material has a surface; and
   said layer sequence that includes said memory layer is applied to all of said surface of said semiconductor material between said semiconductor material and said gate electrode of each one of said plurality of said memory cells and between said semiconductor material and said plurality of said word lines.

9. The configuration according to claim 7, wherein:
   said trench of one of said plurality of said memory cells is formed with walls; and
   said memory layer of said one of said plurality of said memory cells is configured between said walls of said trench of said one of said plurality of said memory cells and is configured in said gate electrode of said one of said plurality of said memory cells.

10. The configuration according to claim 7, wherein:
    said trench of one of said plurality of said memory cells is formed with walls; and
    said memory layer of said one of said plurality of said memory cells is interrupted between said trench of said one of said plurality of said memory cells and said trench of an adjacent one of said plurality of said memory cells.

* * * * *